(12) United States Patent
Okumura et al.

(10) Patent No.: US 7,041,593 B2
(45) Date of Patent: May 9, 2006

(54) METHOD FOR MANUFACTURING THIN-FILM STRUCTURE

(75) Inventors: Mika Okumura, Tokyo (JP); Makio Horikawa, Tokyo (JP); Kiyoshi Ishibashi, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 143 days.

(21) Appl. No.: 10/381,587

(22) PCT Filed: Aug. 1, 2001

(86) PCT No.: PCT/JP01/06639

§ 371 (c)(1),
(2), (4) Date: Apr. 1, 2003

(87) PCT Pub. No.: WO03/015183

PCT Pub. Date: Feb. 20, 2003

(65) Prior Publication Data

US 2004/0020897 A1 Feb. 5, 2004

(51) Int. Cl.
*H01L 21/4763* (2006.01)

(52) U.S. Cl. .............. 438/637; 438/421; 438/611

(58) Field of Classification Search ............. 438/421, 438/611, 637, 638, 640, 657, 672, 738
See application file for complete search history.

(56) References Cited

U.S. PATENT DOCUMENTS

| | | | |
|---|---|---|---|
| 5,550,090 A | 8/1996 | Ristic et al. | |
| 5,633,197 A * | 5/1997 | Lur et al. ............ | 438/668 |
| 5,851,923 A * | 12/1998 | Rolfson ............... | 438/668 |
| 6,444,574 B1 * | 9/2002 | Chu ..................... | 438/638 |
| 6,503,827 B1 * | 1/2003 | Bombardier et al. ... | 438/631 |
| 2005/0032266 A1 * | 2/2005 | Suzuki ................. | 438/50 |

FOREIGN PATENT DOCUMENTS

| | | |
|---|---|---|
| EP | 947816 | 10/1999 |
| JP | 57-089243 | 6/1982 |
| JP | 2-224336 | 9/1990 |
| JP | 04-278464 | 10/1992 |
| JP | 5-55217 | 3/1993 |
| JP | 06-224191 | 8/1994 |
| JP | 09-199474 | 7/1997 |
| JP | 09-260745 | 10/1997 |
| JP | 10-214816 | 8/1998 |
| JP | 10-261806 | 9/1998 |
| JP | 2000-183364 | 6/2000 |
| KR | 1998-0005564 | 3/1998 |
| KR | 1999-003106 | 1/1999 |

* cited by examiner

*Primary Examiner*—Caridad Everhart
(74) *Attorney, Agent, or Firm*—Oblon, Spivak, McClelland, Maier & Neustadt, P.C.

(57) ABSTRACT

A main object of the present invention is to provide a manufacturing method of a thin-film structural body removing a sacrifice film without removing other insulating films.

In order to achieve the above-mentioned object, upon forming an anchor hole (52) which forms an opening on the surface of a wiring (45), two etching steps are employed on a sacrifice film (51). In the first etching step, the sacrifice film (51) is partially removed by a dry etching process with an anisotropy above a wiring (45) with the sacrifice film (51) being left. In the second etching step, the remaining sacrifice film (51) above the wiring (45) is removed by a wet etching process with an isotropic.

9 Claims, 8 Drawing Sheets

METHOD FOR MANUFACTURING THIN-FILM STRUCTURE

TECHNICAL FIELD

The present invention relates to a manufacturing method of a thin-film structural body formed by using a semiconductor processing technique.

BACKGROUND ART

FIG. 15 is a cross-sectional view showing a thin-film structural body 101 formed by using a conventional manufacturing method of a thin-film structural body. The thin-film structural body 101 is provided with a supporting portion 103 and a floating portion 105 supported by the supporting portion 103, and is formed above a substrate 107 by using a conductive material. The floating portion 105, which is placed with a predetermined distance from the substrate 107, extends outwards from the upper portion of the supporting portion 103.

The substrate 107 is provided with a substrate main body 111, a first insulating film 113, a wiring 115 and a second insulating film 117. The first insulating film 113 is formed on the substrate main body 111. The wiring 115 is provided on the surface of the first insulating film 113, and the surface of the first insulating film 113 and the surface of the wiring 115 are substantially flattened without a step portion. The second insulating film 117 covers the surfaces of the wiring 115 and the first insulating film 113 and side faces thereof. Here, the second insulating film 117 has a hole section 117a which opens on the surface of the wiring 115 so that the surface of the wiring 115 is selectively exposed. The supporting portion 103 is formed on the wiring 115 through the hole section 117a.

FIGS. 10 to 14 are cross-sectional views showing a sequence of conventional manufacturing steps of a thin-film structural body. First, a substrate 107 is set. In this stage, the second insulating film 117 has no hole section 117a on the substrate 107. As shown in FIG. 11, the hole section 117a is opened in the second insulating film 117 so that the surface of the wiring 115 is selectively exposed.

Next, a sacrifice film 121 is formed on the surface of the wiring 115 thus selectively exposed and the second insulating film 117. In this manner, a structure shown in FIG. 12 is obtained. Further, a dry etching process is carried out from the surface side of the sacrifice film 121 so that an opening 121a is opened in the sacrifice film 121 and the hole section 117a is opened in the second insulating film 117; thus, an anchor hole 122 is formed so that the surface of the wiring 115 is selectively exposed. Consequently, a structure shown in FIG. 13 is obtained.

Next, as shown in FIG. 14, a thin-film layer 123 is formed on the sacrifice film 121 and the substrate 107 exposed through the anchor hole 122 by using a conductive material.

Thereafter, the thin-film layer 123 is selectively removed so that residual portions of the thin-film layer 123 form a thin-film structural body 101. Successively, the sacrifice film 121 is removed so that a structure shown in FIG. 15 is obtained. Among the residual portions of the thin-film layer 123, the portion fitted into the anchor hole 122 forms the supporting portion 103 and the portion positioned on the sacrifice film 121 forms the floating portion 105.

In the above described conventional manufacturing method, the sacrifice film 121 is desirably formed by using a material which is easily removed by etching, and, for example, a silicon oxide film is employed. With respect to the substrate main body 111, a silicon substrate is employed since a semiconductor processing technique capable of performing fine manufacturing processes is applied thereto. Further, in order to easily form the first insulating film 113 on the silicon substrate, a silicon oxide film is also employed for the first insulating film 113 in the same manner as the sacrifice film 121.

In order to prevent the first insulating film 113 from being also etched upon etching the sacrifice film 121, a material which is less susceptible to etching for the silicon oxide film, and easily processed, such as a silicon nitride film, is employed to form the second insulating film 117.

However, since a dry etching process is carried out so as to form the anchor hole 122, there is a possibility that, when the position of dry etching is offset, the second insulating film 117 fails to sufficiently cover the first insulating film 113. FIG. 16 is a cross-sectional view showing a state where, after the anchor hole 122 has been opened in an offset manner to the left side in the figure, the thin-film layer 123 is formed and this thin-film layer 123 is further patterned. The positional offset of the anchor hole 122 causes the second insulating film 117 to be removed above the wiring 115 at position Q. Consequently, there is a possibility that, at position Q, the second insulating film 117 fails to cover the first insulating film 113.

With respect to the structure shown in FIG. 16, when an etching process is carried out on the sacrifice film 121, the etchant used therein might invade between the thin-film layer 123 filled in the anchor hole 122 and the second insulating film 117 to further reach the first insulating film 113. In particular, when a silicon nitride film is used to form the second insulating film 117, the residual stress is exerted in the stretching direction with the result that the second insulating film 117 easily separates from the side faces of the wiring 115. This separation causes a higher possibility of the etchant for use in the sacrifice film 121 reaching the first insulating film 113 to etc the first insulating film 113.

In order to solve these problems, a method for making the dimension of the anchor hole 122 smaller that that of the wiring 115 so as to provide a greater margin with respect to the positional offset has been proposed. However, the reduced dimension of the anchor hole 122 causes the contact resistance between the thin-film layer 123 filled therein and the wiring 115 to increase, resulting in adverse effects from the viewpoint of electrical characteristics.

Moreover, when the dry etching process for exposing the wiring 115 is carried out, corners 122a are formed on the sacrifice film 121. The corners 122a are generated more conspicuously as the anisotropy of dry etching used for forming the anchor hole 122 becomes higher. Thus, as shown in FIG. 14, the thin film layer 123 which is filled into the anchor hole 122, and covers the sacrifice film 121 is formed. Therefore, as shown in FIG. 15, in the thin-film structural body 101, internal angles 131 are formed between the supporting portion 103 and the floating portion 105. Stresses are concentrated onto each internal angle 131, resulting in a higher possibility of reduction in the strength of the thin-film structural body 101.

DISCLOSURE OF THE INVENTION

An object of the present invention is to provide a manufacturing method of a thin-film structural body removing a sacrifice film without removing other insulating films. Moreover, another object of the present invention is to provide a manufacturing method of a thin-film structural body capable of preventing the generation of internal angles and manufacturing a thin-film structural body having high strength.

In a first aspect of the present invention, a manufacturing method of a thin-film structural body includes: (a) a step of selectively forming a wiring (43, 45) on a first insulating film (33); (b) a step of forming a second insulating film (47) having a hole section (47c) for selectively exposing the wiring on the wiring and the first insulating film; (c) a step of forming a sacrifice film (51) on the second insulating film; (d) a first etching step of forming a recessed section (51c) with the sacrifice film remaining on the first insulating film side by using an anisotropic etching process; (e) a second etching step of forming an anchor hole (52) for exposing the wiring by removing the sacrifice film remaining on the first insulating film side of the recessed section by using isotropic etching process; (f) a step of forming a thin-film layer (53) on the anchor hole and the sacrifice film by using a conductive material, and (g) a step of removing the sacrifice film by etching.

For example, in the first etching step (d), a dry etching process is employed.

According to the first aspect, the anisotropic etching process is used in the first etching step (d) so that it becomes possible to precisely set the diameter of the anchor hole and the position of the anchor hole with respect to the wiring even when the sacrifice film is thick. Moreover, in the second etching step (e), the isotropic etching process is used so that it becomes possible to remove the corners of the sacrifice film which can be formed in the first etching step. Thus, it becomes possible to manufacture a thin-film structural body without internal angles, which has high strength.

In a second aspect of the manufacturing method of a thin-film structural body of the present invention, in the manufacturing method of a thin-film structural body according to the first aspect, the second insulating film (47) covers the edge portion (45a) of the surface of the wiring (45).

According to the second aspect, it is possible to reduce the possibility that, even after removal of the sacrifice film in the step (g), the etchant enters a gap between the second insulating film and the first insulating film. Therefore, it is possible to reduce the possibility that the first insulating film is also etched.

In a third aspect of the manufacturing method of a thin-film structural body of the present invention, in the manufacturing method of a thin-film structural body according to the second aspect, in the step (e), an etching process is carried out by using an etchant which exerts a higher etching rate on the sacrifice film than on the second insulating film. For example, the first insulating film (33) and the sacrifice film (51) are formed by using oxide films, and the second insulating film (47) is formed by using a nitride film.

According to the third aspect, even when there is an offset in the position at which the anchor hole is to be formed, it is possible to reduce the possibility that the second insulating film is unnecessarily etched. Therefore, it is possible to reduce the possibility that, even after the sacrifice film has been removed at the step (g), the etching further reaches the first insulating film.

In the present invention, for example, the wiring (43, 45) is formed by using doped polysilicon. Moreover, for example, the thin-film layer (53) is formed by using doped polysilicon.

Moreover, in the present invention, the manufacturing method of a thin-film structural body may further includes (h) a step of patterning the thin-film layer (53) prior to the step (g) and after the step (f).

Furthermore, in the present invention, in the process (e), the etching process may be carried out on the sacrifice film without using any masks.

These and other objects, features, aspects and advantages of the present invention will become more apparent in conjunction with the following detailed description and the accompanying drawings.

BEST MODE FOR CARRYING OUT THE INVENTION

Figure 1:
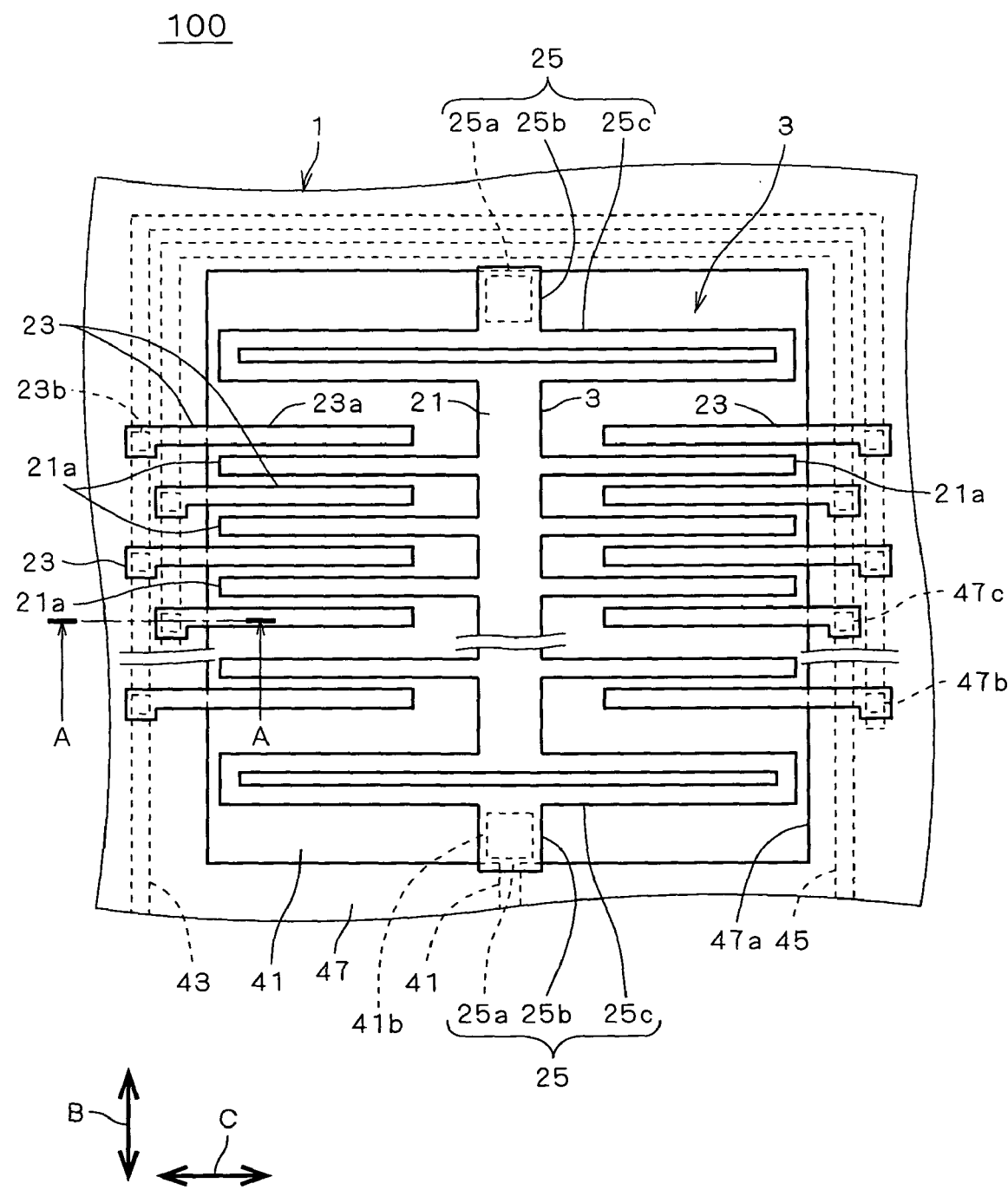
FIG. 1 is a plan view showing the configuration of a main part of a semiconductor acceleration sensor to which a manufacturing method of a thin-film structural body according to the present invention can be applied.
Figure 2:
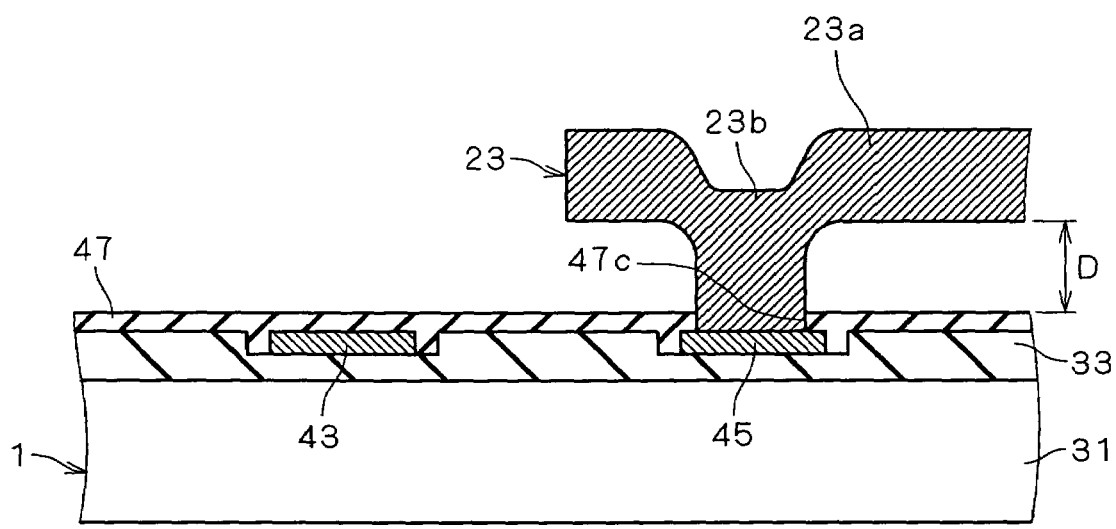
FIG. 2 is a cross-sectional view taken along line A—A of FIG. 1.

FIG. 1 is a plan view showing the configuration of a main part of a semiconductor acceleration sensor 100 to which a manufacturing method of a thin-film structural body according to the present invention can be applied. Moreover, FIG. 2 is a cross-sectional view taken along line A—A of FIG. 1. The semiconductor acceleration sensor 100 is provided with a substrate 1 serving as a sensor substrate, and a sensor part 3 which is formed above the substrate 1 (on the front side of the paper face of FIG. 1) and which has a function of detecting acceleration.

As shown in FIG. 1, the sensor part 3 is provided with a movable mass body 21, a plurality of fixed structures 23 and a plurality of beams 25. The mass body 21, the fixed structures 23 and the beams 25, which correspond to a thin-film structural body of the present invention, are formed by a conductive material, for example, doped polysilicon made by silicon doped with impurities such as phosphorus.

The mass body 21 has a plurality of movable electrode portions 21a that extend in direction C perpendicular to direction B of acceleration to be detected. Each of the fixed structures 23 is provided with a fixed electrode portion 23a formed in a manner so as to extend in direction C, and a supporting portion 23b supporting the fixed electrode portion 23a. The fixed electrode portions 23a are placed with predetermined distance from each other in direction B. The plurality of fixed structures 23a are respectively connected to either of the wirings 43, 45 through the supporting portions 23b. However, the application of the present invention is not intended to be limited by which wiring each fixed structure 23 is connected to, wiring 43 or wiring 45.

As shown in FIG. 2, the fixed electrode portions 23a are placed with a predetermined distance D from the substrate 1 to be floating. The supporting portion 23b is connected to the substrate 1, more specifically, to the wiring 45 at position A—A. In the same manner as the fixed electrode portions 23a, the movable electrode portions 21a are also placed with a predetermined distance from the substrate 1.

Each beam 25 is integrally formed with the mass body 21 so as to suspend the mass body 21 above the substrate 1. Each beam 25 is provided with a supporting portion 25a protruding upward from the substrate 1, a spring portion 25c formed on the end edge of the mass body 21 with respect to direction B, and a connecting portion 25b connecting the supporting portion 25a and the spring portion 25c. The spring portion 25c is elastically bent and deformed at least along direction B. Thus, the mass body 21 is allowed to move along direction B while maintaining a restoring force. One end of the supporting portion 25a is connected to the wiring 41 at its lower portion.

The fixed electrode portions 23a and the movable electrode portions 21a are alternately placed with distances from each other in direction B. When acceleration is applied to the acceleration sensor 100 in direction B, the mass body 21 moves so that the distance between the movable electrode portion 21a and the fixed electrode portion 23a is changed. Therefore, the electrostatic capacity, formed by the movable electrode portion 21a and the fixed electrode portion 23a, is measured externally by using wirings 41, 43 and 45 so that it is possible to detect the applied acceleration.

As shown in FIG. 2, the substrate 1 is provided with a substrate main body 31, an oxide film 33, wirings 43, 45 and a nitride film 47. Moreover, as shown in FIG. 1, it is also provided with a wiring 41. The oxide film 33 is formed on the substrate main body 31. The surface of the oxide film 33 is flat, and the wirings 41, 43, 45 are formed on the oxide film 33. For example, the surface of the oxide film 33 and the surfaces of the wirings 41, 43, 45 are set on the same plane.

The nitride film 47 covers the respective surfaces and side faces of the wirings 41, 43, 45 and the oxide film 33. Here, the nitride film 47 has hole sections 47a, 47b, 47c that respectively allow the surfaces of the wirings 41, 43, 45 to be exposed selectively. FIG. 2 shows a state where the supporting portion 23b is connected to the wiring 45 through the hole section 47c.

In the same manner, the supporting portion 25a and the supporting portion 23b are respectively connected to the wirings 41, 43 through the hole sections 47a, 47b. Here, the wiring 41 is formed below the sensor part 3 so as to be widely exposed.

FIGS. 3 to 9 are cross-sectional views showing a method for manufacturing a semiconductor acceleration sensor 101 in its sequence of steps, and each of the figures show a cross-section at a position taken along line A—A.

Figure 3:
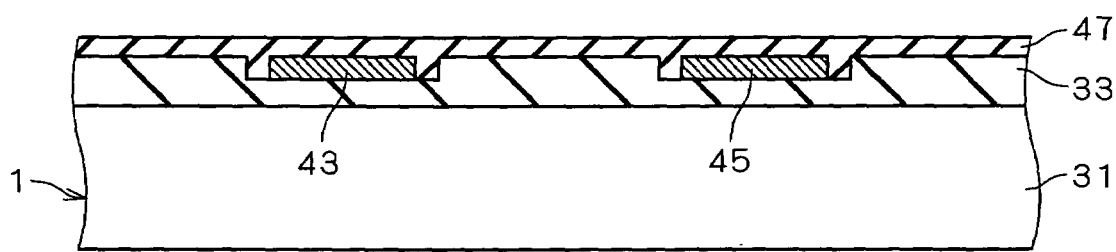
FIGS. 3 to 9 are cross-sectional views showing manufacturing steps of the structure shown in FIG. 2.

First, a substrate main body 31 is set, and an oxide film 33 is formed thereon. For example, the substrate main body 31 is made from silicon which is a semiconductor, and the oxide film 33 is formed by thermal oxidation of the substrate main body 31. The wirings 41, 43, 45 are formed by, for example, the following steps. First, recessed sections are formed on the oxide film 33 at areas in which the wirings 41, 43, 45 are to be formed. A conductive material, for example, doped polysilicon, having a thickness that approximately corresponds to the recessed section is deposited, and patterned with a width narrower than the width of the recessed section. After these processes, the residual doped polysilicon is allowed to form the wirings 41, 43, 45 and these are selectively formed on the oxide film 33. Next, a nitride film 47 is formed on the oxide film 33 and the wirings 41, 43, 45 so that a structure shown in FIG. 3 is obtained. Here, since no wiring 41 is located along position A—A, no wiring 41 appears on FIGS. 3 to 8.

Figure 4:
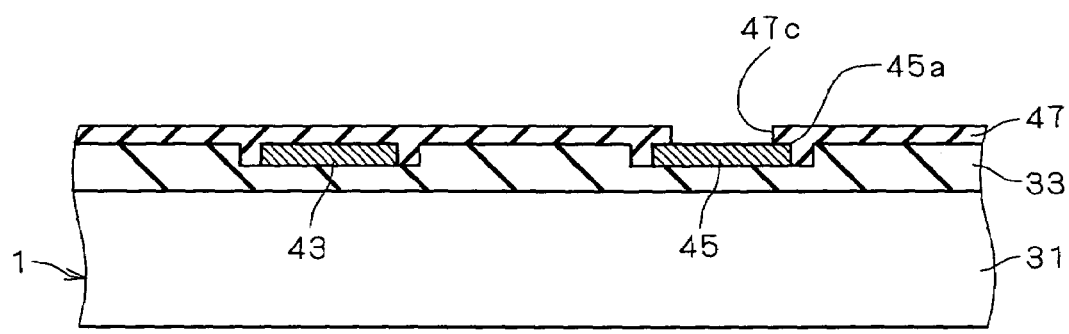

Next, the nitride film 47 is selectively removed by etching, and a hole section 47c is formed in the nitride film 47 to obtain a structure shown in FIG. 4. For reasons which will be described later, the hole section 47c is desirably designed to cover the edge portion 45a of the surface of the wiring 45. The hole sections 47a, 47b may be formed in the same manner.

Figure 5:
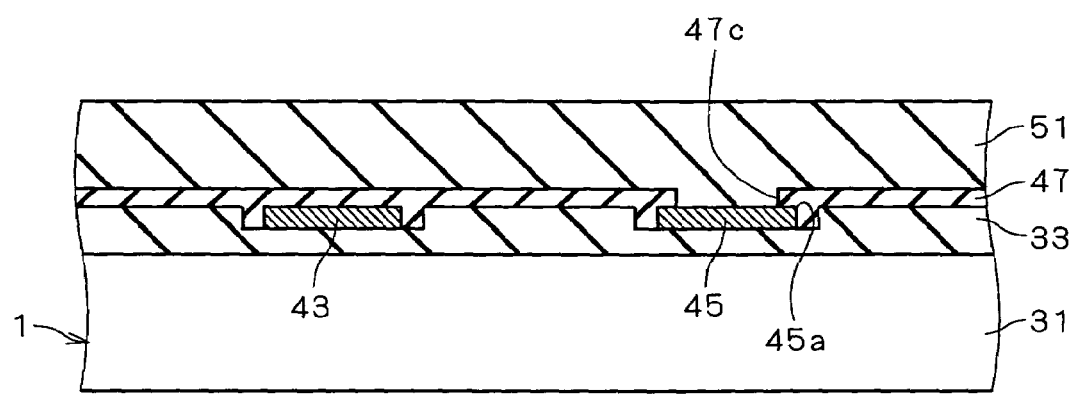

A sacrifice film 51 is formed on the surface of the wiring 45 exposed through the hole section 47c and the nitride film 47 to obtain a structure shown in FIG. 5. The sacrifice film 51 is formed by using, for example, an oxide film, a PSG (phospho silicate glass) film or a BPSG (boro-phospho silicate glass) film.

Next, at positions in which the supporting portions 25a, 23b are to be formed, a dry etching process is carried out on the sacrifice film 51 so that one portion thereof is selectively removed. Since the supporting portion 23b to be connected to the wiring 45 is formed at position A—A, a recessed section 51c is formed not above the wiring 43, but above the wiring 45, in FIG. 6. The sacrifice film 51 remains below the recessed section 51c (the oxide film 33 side) with a thickness d (>0). In other words, in the present invention, the dry etching process with respect to the sacrifice film 51 is completed with the sacrifice film 51 remaining thereon. The above described dry etching process is executed by using patterned resist (not shown) as a mask, with the etching time being controlled. Corners 51b are generated on the periphery of the recessed section 51c through the dry etching process. The corners 51b are generated more conspicuously as the anisotropy of the dry etching becomes higher.

Figure 7:
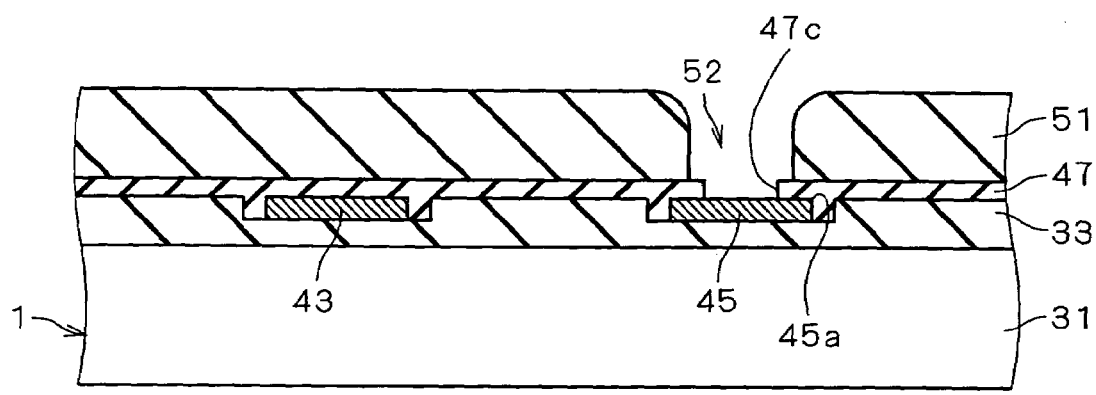

Next, a wet etching process is carried out on the sacrifice film 51 which is left and placed below the recessed section 51c. For example, this wet etching process is carried out by using patterned resist (not shown) that has opening through the recessed section 51c as a mask. Thus, as shown in FIG. 7, the anchor hole 52 through which the wiring 45 is exposed is opened. Anchor holes are also formed at hole sections 47a, 47b in the same manner.

During the above-mentioned etching process, the corners 51b are also removed through over etching. The corners 51b are removed more effectively as the isotropy of the wet etching becomes higher. Since the sacrifice film 51 is formed by, for example, an oxide film, a wet etching process which uses an etchant exerting a higher etching rate on the oxide film than on the nitride film is desirably employed. Thus, even when there is a positional offset on the mask used for removing the sacrifice film 51 remaining below the recessed section 51c, it is possible to prevent over etching from proceeding to the nitride film 47.

Alternatively, the wet etching process may be carried out without using any masks. This is because the film thickness of the sacrifice film 51 remaining below the recessed section 51c is thinner than the film thickness of the sacrifice film 51 at the other positions so that the sacrifice film 51 is allowed to remain at positions other than the position above the wiring 45 even after the formation of the anchor hole 52.

Figure 8:
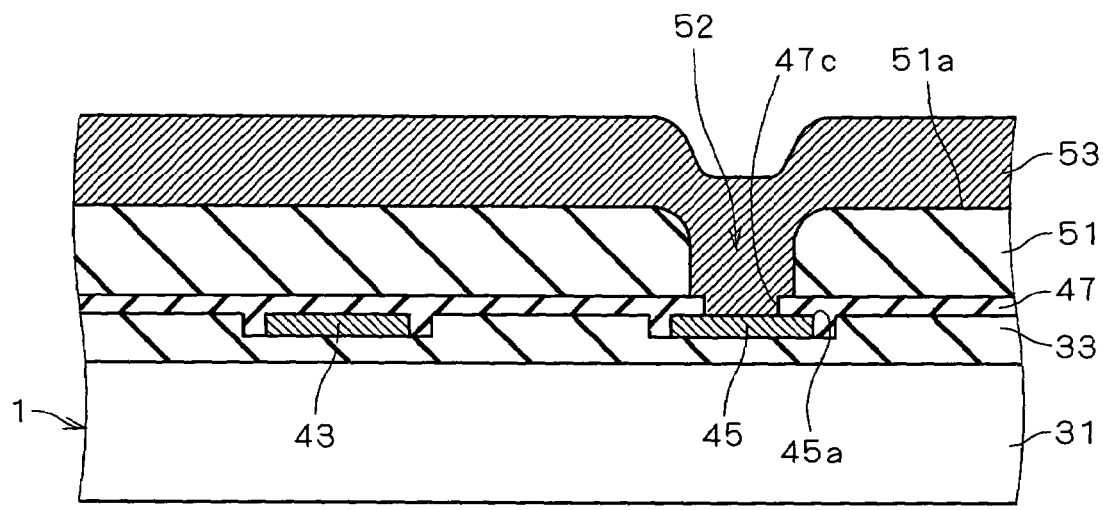

Next, as shown in FIG. 8, a thin-film layer 53 is formed on the remaining sacrifice film 51 and the substrate 1 exposed through the anchor hole 52. For example, the film thickness of the thin film layer 53 is thicker than the film thickness of the sacrifice film 51. In this case, the anchor hole 52 is filled with the thin-film layer 53.

Figure 9:
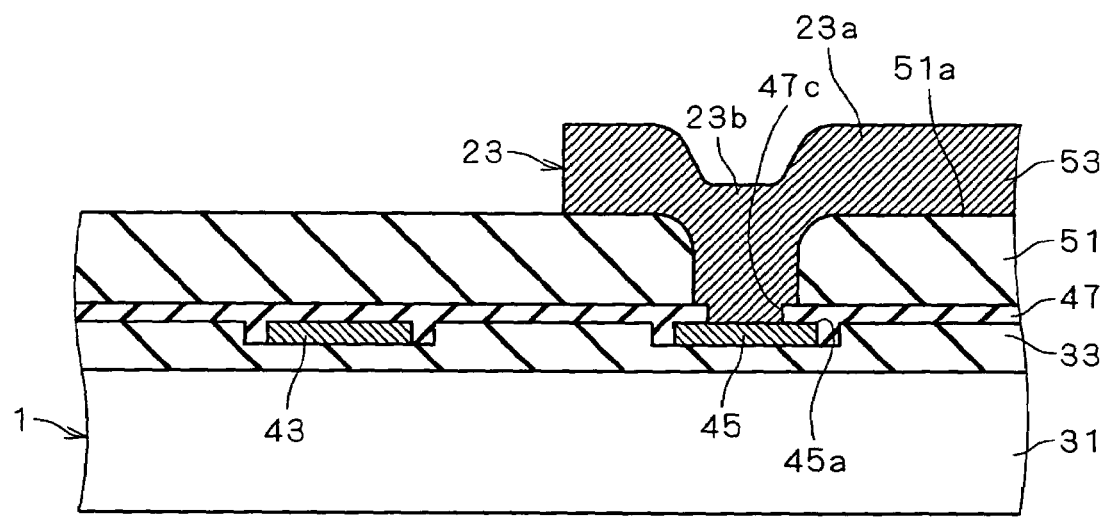
Figure 10:
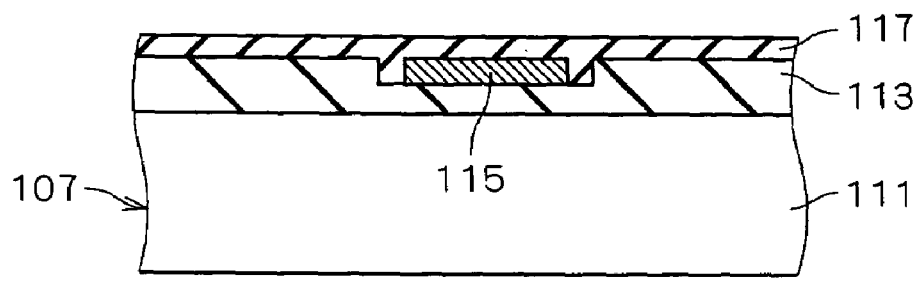
FIGS. 10 to 14 are cross-sectional views showing a sequence of conventional manufacturing steps of a thin-film structural body.
Figure 11:
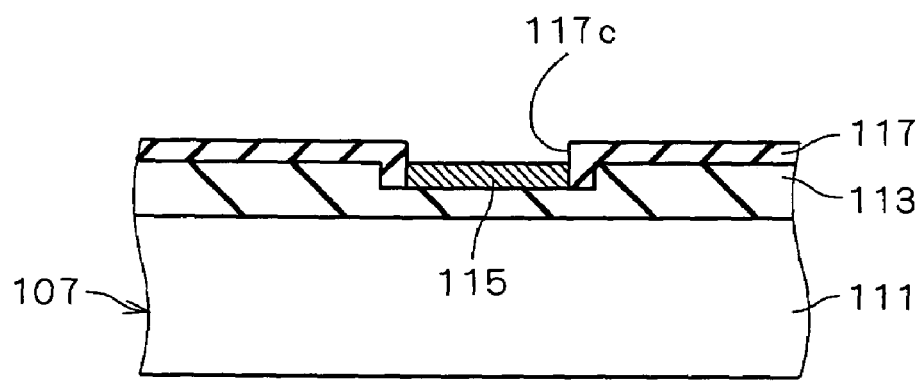
Figure 12:
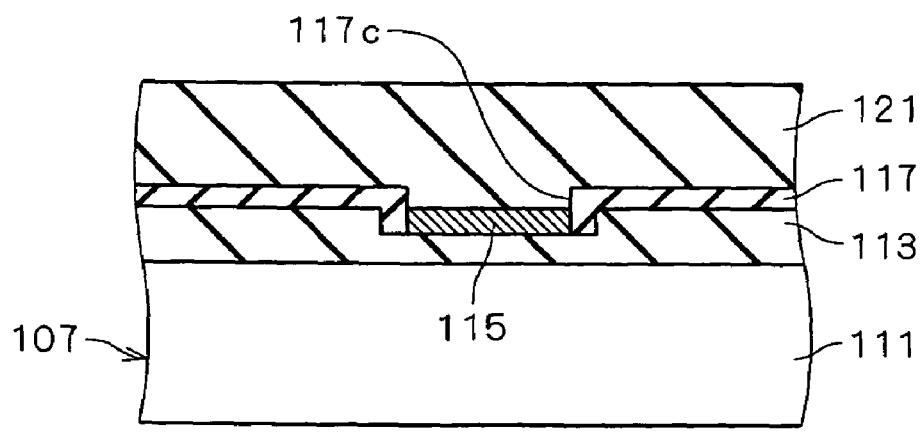
Figure 13:
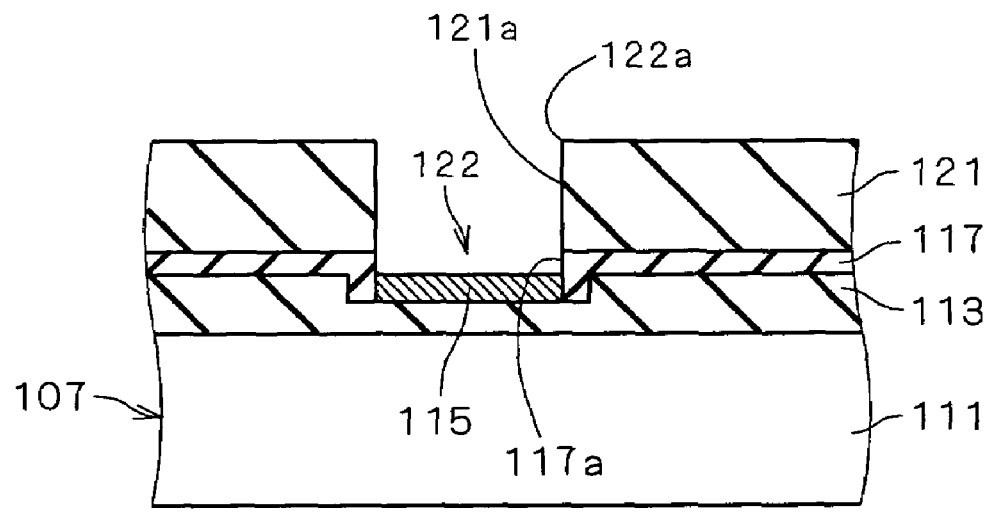
Figure 14:
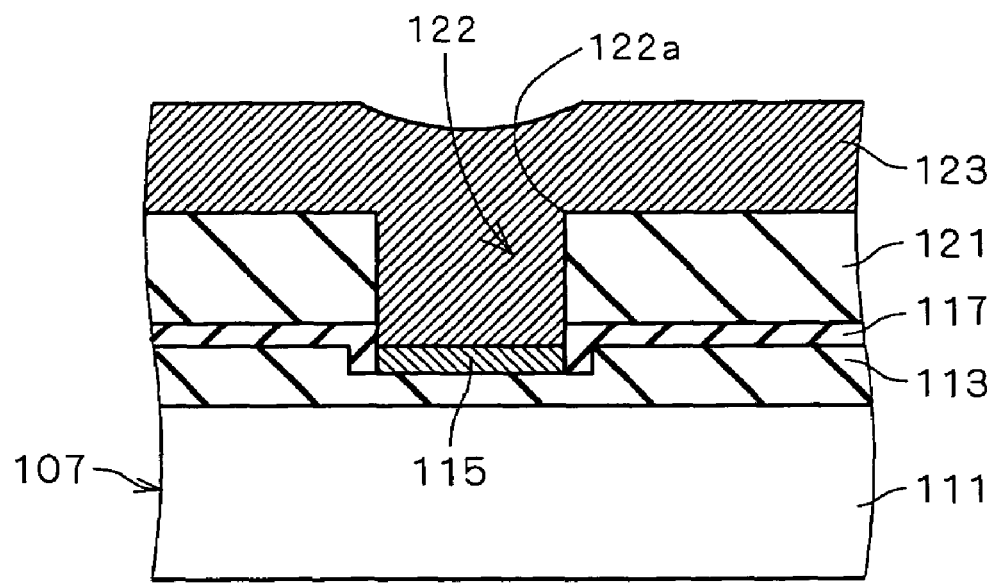
Figure 15:
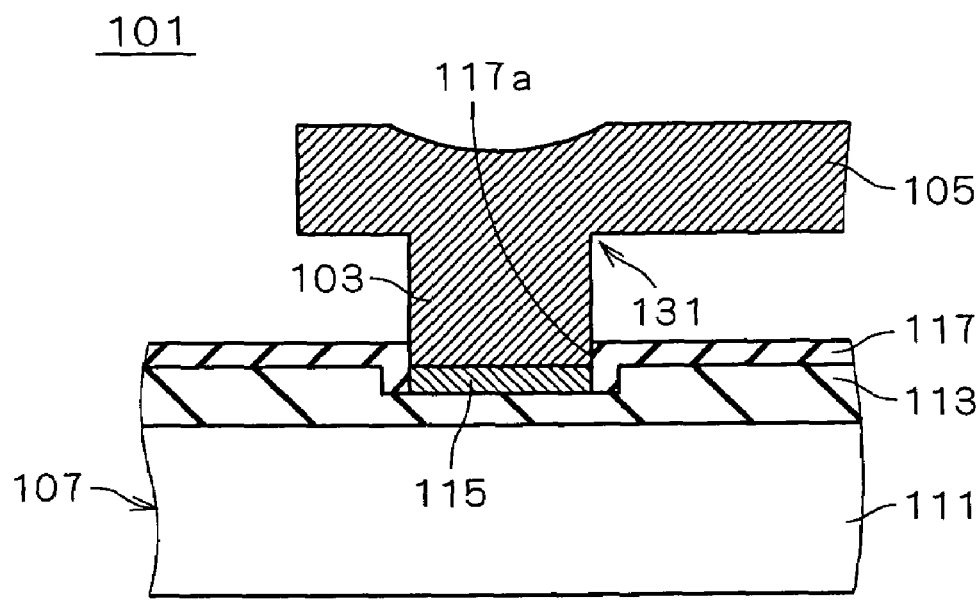
FIG. 15 is a cross-sectional view of a thin-film structural body formed by the conventional manufacturing method of a thin-film structural body.
Figure 16:
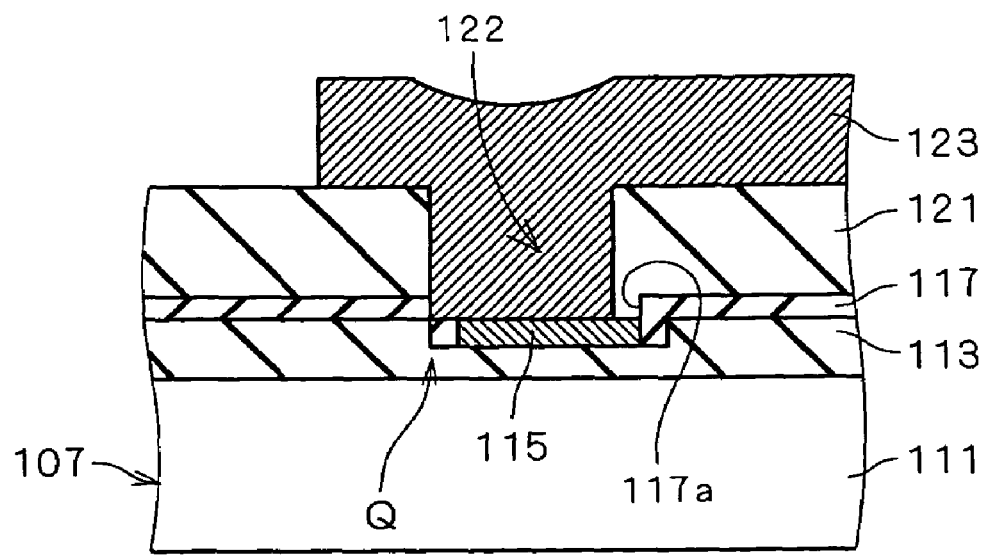
FIG. 16 is a cross-sectional view indicative of problems with the conventional manufacturing method of a thin-film structural body.

Then, as shown in FIG. 9, the thin-film layer 53 is selectively removed and patterned so that the mass body 21, the beams 25 and the fixed electrodes 23 are formed by the residual portions of the thin-film layer 53. In order to achieve the above-mentioned objects, the thin-film layer 53 is formed by using a conductive material, for example, doped polysilicon. The portion of the thin-film layer 53 fitted into the anchor hole 52 is allowed to form the supporting portion 23b, and the portion of the thin-film layer 53 positioned on the sacrifice film 51 is allowed to form the fixed electrode portion 23a. The supporting portion 25a, the mass body 21, the spring portion 25c and the connecting portion 25b are formed by the thin-film layer 53 in the same manner.

Thereafter, the sacrifice film 51 is removed to obtain a structure shown in FIGS. 1 and 2.

Figure 6:
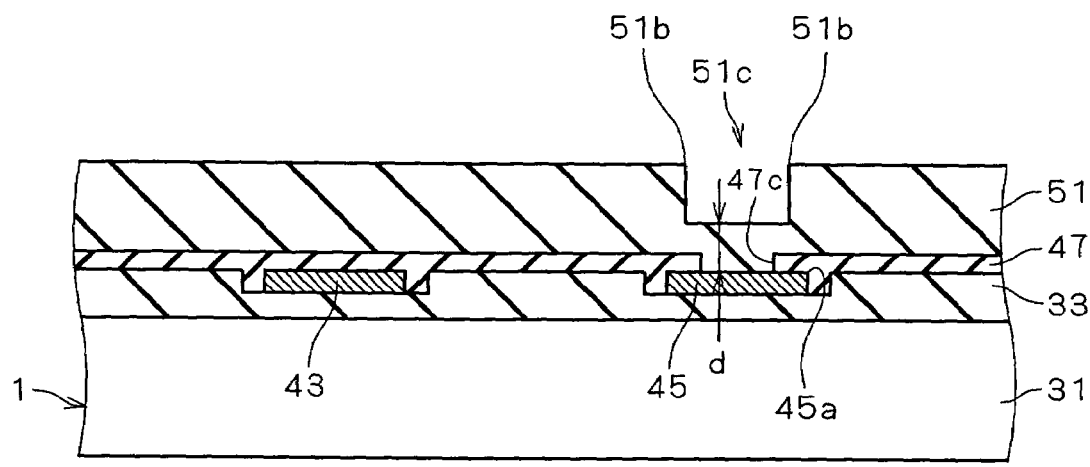

As described above, according to the present invention, when the anchor hole 52 is opened, for example, at position A—A so as to expose the wiring 45, first and second etching steps are used. In other words, a dry etching process is employed as the first etching step in which the sacrifice film 51 forms the recessed section 51c which remains at the lower portion (the oxide film 33 side) (FIG. 6). In this case, when a dry etching process having high anisotropy is adopted, it is possible to precisely set the diameter of the anchor hole 52 and the position of the anchor hole 52 with respect to the wiring 45 easily, even when the sacrifice film 51 is thick.

In the second etching step, the sacrifice film 51 remaining below the recessed section 51c is removed. Thus, the anchor hole 52 is formed in combination with the hole section 47c which is preliminarily opened in the nitride film 47 (FIG. 7). The corners 51b, which might be formed in the first etching step, are removed by using a wet etching process having high isotropy during the second etching step.

In the second etching step, an etchant which exerts a higher etching rate on an oxide film than on a nitride film may be employed. Therefore, in the second etching step, even when there is an offset in the etching position in the second etching step, it is possible to greatly reduce the possibility of the nitride film 47 being over-etched. Moreover, since the hole section 47c covers the edge portion 45a of the surface of the wiring 45 so that, when the sacrifice film 51 is etched and removed (FIG. 9, FIG. 2), it becomes possible to considerably reduce the possibility that the etchant invades between the nitride film 47 and the oxide film 33. In other words, it is possible to reduce the possibility of the oxide film 33 being also etched by the etching process for removing the sacrifice film 51.

Furthermore, since the corners 51b are removed through the second etching step, it is possible to eliminate the formation of internal angles 131 in the thin-film structural body which has been described in the background art. Thus, it becomes possible to manufacture a thin-film structural body having high strength.

While the present invention has been described in detail, the above description is illustrative in all aspects and the present invention is not restrictive thereto. It will be understood that numerous variants which are not illustrated can be supposed without departing from the scope of the invention.

The invention claimed is:

1. A manufacturing method of a thin-film structural body, comprising:
    (a) selectively forming a wiring on a first insulating film;
    (b) forming a second insulating film having a hole section for selectively exposing said wiring on said wiring and said first insulating film;
    (c) forming a sacrifice film on said second insulating film;
    (d) a first etching to form a recessed section with said sacrifice film remaining on said first insulating film side by using an anisotropic etching process;
    (e) a second etching to form an anchor hole for exposing said wiring by removing said sacrifice film remaining on said first insulating film side of said recessed section by using isotropic etching process;
    (f) forming a thin-film layer on said anchor hole and said sacrifice film by using a conductive material, and
    (g) removing said sacrifice film by etching.

2. The manufacturing method of a thin-film structural body according to claim 1, wherein
    a dry etching process is employed as said anisotropic etching process in said first etching (d).

3. The manufacturing method of a thin-film structural body according to claim 1, wherein
    said wiring is formed by using doped polysilicon.

4. The manufacturing method of a thin-film structural body according to claim 1, wherein
    said thin-film layer is formed by using doped polysilicon.

5. The manufacturing method of a thin-film structural body according to claim 1, further comprising:
    (h) patterning said thin-film layer prior to said removing (g) and after said forming a thin-film layer (f).

6. The manufacturing method of a thin-film structural body according to claim 1, wherein
    in said second etching (e), an etching process is carried out on said sacrifice film without using a mask.

7. The manufacturing method of a thin-film structural body according to claim 1, wherein
    said second insulating film covers an edge portion of the surface of said wiring.

8. The manufacturing method of a thin-film structural body according to claim 7, wherein
    in said second etching (e), an etching process is carried out by using an etchant which exerts a higher etching rate on said sacrifice film than on said second insulating film.

9. The manufacturing method of a thin-film structural body according to claim 8, wherein
    said first insulating film and said sacrifice film are formed by using oxide films, and said second insulating film is formed by using a nitride film.

* * * * *